United States Patent
Horiuchi et al.

[11] Patent Number: 6,001,737
[45] Date of Patent: Dec. 14, 1999

[54] METHOD OF FORMING A SEMICONDUCTOR DEVICE HAVING A TITANIUM SALICIDE SHALLOW JUNCTION DIFFUSION LAYER

[75] Inventors: Tadahiko Horiuchi; Hiroshi Ito; Naohiko Kimizuka, all of Tokyo, Japan

[73] Assignee: NEC Corporation, Tokyo, Japan

[21] Appl. No.: 08/831,002

[22] Filed: Mar. 31, 1997

[30] Foreign Application Priority Data

Mar. 29, 1996 [JP] Japan ..................... 8-075051

[51] Int. Cl.$^6$ ..................... H01L 21/28
[52] U.S. Cl. ............ 438/683; 438/486; 438/655; 438/660
[58] Field of Search ............ 438/597, 630, 438/649, 651, 655, 663, 664, 682, 683, 660, 483, 486; 257/383, 384, 754, 768

[56] References Cited

U.S. PATENT DOCUMENTS

| | | | |
|---|---|---|---|
| 5,023,201 | 6/1991 | Stanasolovich et al. | 438/655 |
| 5,665,646 | 9/1997 | Kitano | 438/592 |
| 5,741,725 | 4/1998 | Inoue et al. | 438/664 |
| 5,750,437 | 5/1998 | Oda | 438/592 |
| 5,849,634 | 12/1998 | Iwata | 438/655 |

OTHER PUBLICATIONS

S. N. Hong et al., "Material and Electrical Properties of Ultra–Shallow p$^+$–n Junctions Formed by Low–Energy Ion Implantation and Rapid Thermal Annealing", pp. 476–486, IEEE Transactions On Electron Devices, vol. 38, No. 3, Mar. 1991.

D. S. Wen et al., "Defect annihilation in shallow p$^+$junctions using titanium silicide", pp. 1182–1184, American Institute of Physics, Appl. Phys. Lett. 51(15), Oct. 12, 1987.

*Primary Examiner*—T. N. Quach
*Attorney, Agent, or Firm*—Young & Thompson

[57] ABSTRACT

A method of recovering crystal defects in an impurity doped diffusion silicon layer in contact with a C54 crystal phase titanium silicide layer includes the step of causing a cohesion reaction of the C54 crystal phase titanium silicide layer by heat treating the C54 crystal phase titanium silicide layer so as to cause a vacancy-diffusion of lattice-vacancy of silicon atoms from the C54 crystal phase titanium silicide layer into the impurity doped diffusion silicon layer including the crystal defects while maintaining the continuity of the C54 crystal phase titanium silicide layer.

12 Claims, 9 Drawing Sheets

METHOD OF FORMING A SEMICONDUCTOR DEVICE HAVING A TITANIUM SALICIDE SHALLOW JUNCTION DIFFUSION LAYER

BACKGROUND OF THE INVENTION

The present invention relates to a method of forming a semiconductor device, and more particularly to a method of forming a semiconductor device having a titanium salicide shallow junction diffusion layer.

High integration of a semiconductor device has been made by scaling down semiconductor elements.

For scaling down of the semiconductor elements, it is important to shallow the junction depth of diffusion regions such as source/drain regions or emitter regions. Further, it is also important to reduce an effective sheet resistance as the depth of the diffusion layers is reduced. For those purposes, the titanium salicide diffusion layers have been on the use, wherein a titanium silicide layer having a C54 crystal structure is provided by use of self-alignment technique. Under 0.25 micrometers design rule, the junction depth of the diffusion layer is 0.15 micrometers. Such shallow junction diffusion layer may be formed by an ion-implantation of a conductive impurity. Notwithstanding, it is difficult to form a shallow junction diffusion layer having a junction depth of less than 0.15 micrometers by use of normal ion-implantation of a conductive impurity. Particularly, it was difficult to form a $p^+$-type diffusion layer. For example, it was difficult to form a shallow diffusion layer of a junction depth of approximately 0.08 micrometers required under 0.13 micrometers design rule. Also it is required by a normal ion-implantation to form an $n^+$-type shallow junction diffusion layer having a depth of approximately 0.05 micrometers required under 0.1 micrometer design rule.

The cause of difficulty in forming such extremely shallow diffusion layers by ion-implantation of the conductive impurity is in a channeling phenomenon in ion-implantation process. Theoretically, at a high dose of ions, silicon substrate surface is made amorphous so that the channeling phenomenon is prevented. Actually, however, the channeling phenomenon appears within an initial time period of the ion-implantation without the silicon substrate surface being made of amorphous.

A conventional method of forming a diffusion layer with avoiding such channeling phenomenon is disclosed in IEEE, Transaction-of-electron-devices, ED-38, pp. 476–486. In accordance with the conventional method, before the ion-implantation of conductive impurity is carried out, an ion-implantation of Ge has been carried out into a predetermined region of the diffusion layer of an n-type silicon substrate surface for forming an amorphous silicon. Subsequently, an ion-implantation of B or $BF_2$ is carried out. Further, a rapid thermal anneal is carried out at a temperature of 1050° C. to form a $p^+$-type shallow having approximately 0.1 micrometer. In the above conventional method, in place of Ge, Si may be ion-implanted.

It is possible to form the shallow junction diffusion layer by use of the above method. However, the channeling phenomenon is likely to be caused by the ion-implantation of Ge or Si for forming the amorphous silicon. Those diffusion layers increase in junction leakage probability as compared to the normal ion-implantation of conductive impurity. Such junction leakage is caused by residual crystal defects due to insufficient recovery of crystal structure from amorphous structure.

It is disclosed in 1987 Applied Physics Letter Vol. 51, No. 12, pp. 1182–1184, that an amorphous silicon layer is formed on a silicon substrate surface to form a diffusion layer over the amorphous silicon layer before a C49 structured crystal phase titanium silicide layer is formed by self-alignment over the diffusion layer. A heat treatment to the C49 structured crystal phase titanium silicide layer is then carried out to cause a phase transition from C49 to C54 thereby forming a C54 structured crystal phase titanium silicide layer. As a result, the crystal defects generated by the formation of amorphous layer are reduced. The junction leakage is reduced by the reduction of the crystal defects. It was measured that $p^+$-n junction is in the order of $1 \times 10^{-8}$ $A/mm^2$ or 10 $nA/mm^2$. The actually required device more scaled down than 0.25 micrometers design rule is approximately $1 \times 10^{-10}$ $A/mm^2$ or 100 $pA/mm^2$. It is therefore difficult to make a direct combination of the above described two techniques in order to form a titanium salicide shallow diffusion layer.

In the above circumstances, it had been required to develop a novel method of forming a titanium salicide shallow junction diffusion layer while keeping a reduced sheet resistance and avoiding any increase in p-n junction leakage.

SUMMARY OF THE INVENTION

Accordingly, it is an object of the present invention to provide a novel method of forming a titanium salicide shallow junction diffusion layer free from any problems as described above.

It is a further object of the present invention to provide a novel method of forming a titanium salicide shallow junction diffusion layer with further crystal defects.

It is a still further object of the present invention to provide a novel method of forming a titanium salicide shallow junction diffusion layer while keeping a reduced sheet resistance.

It is yet a further object of the present invention to provide a novel method of forming a titanium salicide shallow junction diffusion layer without any increase in p-n junction leakage.

The above and other objects, features and advantages of the present invention will be apparent from the following descriptions.

The present invention provides a method of recovery of crystal defects in an impurity doped diffusion silicon layer extending in contact with a C54 crystal phase titanium silicide layer. The method comprises the step of causing a cohesion reaction of the C54 crystal phase titanium silicide layer by heat treating the C54 crystal phase titanium silicide layer so as to cause a vacancy-diffusion of lattice-vacancy of silicon atoms from the C54 crystal phase titanium silicide layer into the impurity doped diffusion silicon layer including the crystal defects.

It is preferable that the crystal defects have been generated in having formed an amorphous silicon layer which is then made into the impurity doped diffusion silicon layer.

It is also preferable that the heat treatment is carried out at a temperature for a time to cause no disconnection of the C54 crystal phase titanium silicide layer.

It is also preferable that the temperature is approximately 650° C. and the time is approximately 10 minutes.

It is also preferable that the heat treatment is carried out at a temperature for a time to cause a disconnection of the C54 crystal phase titanium silicide layer.

In this case, it is also preferable that the temperature is approximately 950° C. and the time is approximately 10 minutes.

The present invention provides a method of forming an extremely shallow titanium salicide diffusion layer comprising the steps of forming an amorphous silicon layer in a silicon substrate by an ion-implantation, subjecting the silicon substrate to a first heat treatment to cause a crystallization of the amorphous silicon layer to form an impurity doped diffusion silicon layer, depositing a titanium film on the impurity doped diffusion silicon layer, subjecting the impurity doped diffusion silicon layer to a second heat treatment to cause a silicidation reaction of titanium with silicon thereby forming a C49 crystal phase titanium silicide layer in an upper region of the impurity doped diffusion silicon layer, subjecting the C49 crystal phase titanium silicide layer to a third heat treatment to cause a crystal phase transition from C49 into C54 so that the C49 crystal phase titanium silicide layer is made into a C54 crystal phase titanium silicide layer, and causing a cohesion reaction of the C54 crystal phase titanium silicide layer by a fourth heat treatment to the C54 crystal phase titanium silicide layer so as to cause a vacancy-diffusion of lattice-vacancy of silicon atoms from the C54 crystal phase titanium silicide layer into the impurity doped diffusion silicon layer including the crystal defects.

It is preferable that the crystal defects have been generated in having formed an amorphous silicon layer which is then made into the impurity doped diffusion silicon layer.

It is preferable that the heat treatment is carried out at a temperature for a time to cause no disconnection of the C54 crystal phase titanium silicide layer.

In his case, it is further preferable that the temperature is approximately 650° C. and the time is approximately 10 minutes.

It is also preferable that the heat treatment is carried out at a temperature for a time to cause a disconnection of the C54 crystal phase titanium silicide layer.

It is also preferable that the temperature is approximately 950° C. and the time is approximately 10 minutes.

BRIEF DESCRIPTIONS OF THE DRAWINGS

Preferred embodiments of the present invention will be described in detail with reference to the accompanying drawings.

DESCRIPTION OF THE PREFERRED EMBODIMENTS

Figure 2:
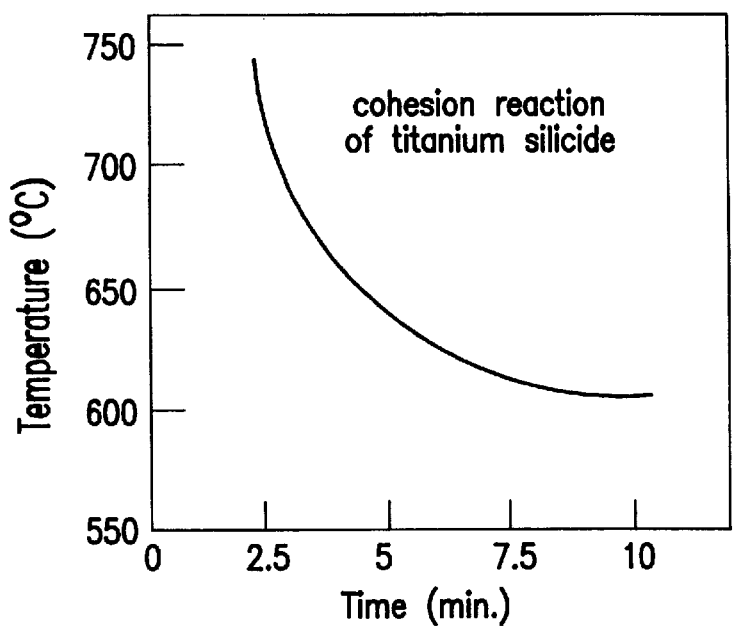
FIG. 2 is a diagram illustrative of a relationship of cohesion reaction of a titanium silicide layer versus temperature of heat treatment and a time of the heat treatment.
Figure 3:
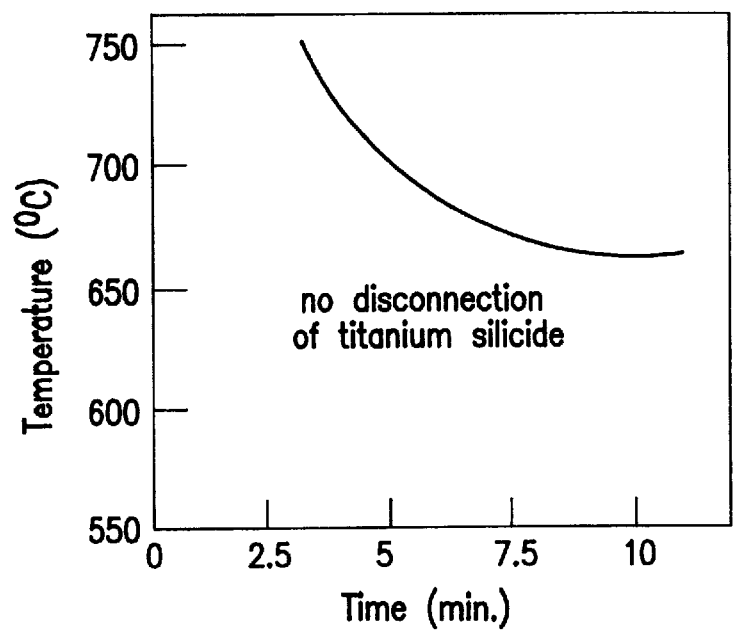
FIG. 3 is a diagram illustrative of a relationship of no disconnection of a titanium silicide layer versus a temperature of heat treatment and a time of the heat treatment.

A first embodiment according to the present invention will be described in detail with reference to FIGS. 1A through 1E and FIGS. 2 and 3 in which a novel method of forming a semiconductor substrate on which a titanium salicide shallow junction diffusion layer is formed. FIGS. 1A through 1E are fragmentary cross sectional elevation views illustrative of a semiconductor substrate on which a titanium salicide shallow junction diffusion layer is formed. FIG. 2 is a diagram illustrative of a relationship of cohesion reaction of a titanium silicide layer versus temperature of heat treatment and a time of the heat treatment. FIG. 3 is a diagram illustrative of a relationship of no disconnection of a titanium silicide layer versus a temperature of heat treatment and a time of the heat treatment.

Figure 1A:
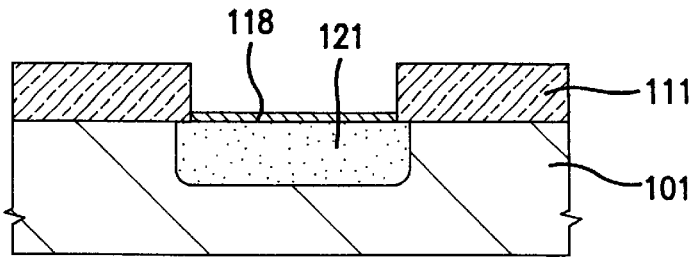
FIGS. 1A through 1E are fragmentary cross sectional elevation views illustrative of a method of forming a semiconductor substrate on which a titanium salicide shallow junction diffusion layer is formed in a first embodiment according to the present invention.

With reference to FIG. 1A, an n-type silicon substrate 101 is prepared, which has an impurity concentration of approximately $1 \times 10^{17}$ cm$^{-3}$. A field oxide film 111 is formed over the n-type silicon substrate 1. The field oxide film 111 has a thickness of 0.2 micrometers. An opening is formed in the field oxide film 111 whereby an active region of the n-type silicon substrate 101 is shown through the opening. A thermal oxidation to the active region of the n-type silicon substrate 101 is carried out to form a silicon oxide film 118 over the active region of the n-type silicon substrate 101. The silicon oxide film 118 has a thickness of approximately 10 nanometers. Namely, a width of the opening is 0.2 micrometers. It is possible that in accordance with the design requirement, the width of the opening is not less than 5 micrometers.

As a modification, in place of the n-type silicon substrate 101, it is possible to form an n-well region having an impurity concentration of $1 \times 10^{17}$ cm$^{-3}$ in an upper region of a p-type silicon substrate having an impurity concentration of $1 \times 10^{15}$ cm$^{-3}$ before a field oxide film is formed over the n-well region and the p-type silicon substrate for subsequent formation of an opening in the field oxide film so that an active region of the n-well region is shown through the opening.

The description will be returned to the first embodiment of the present invention. An ion-implantation of Si into the active region is carried out by use of the field oxide films 111 as a mask at a dose of $1 \times 10^{15}$ cm$^{-3}$ at an ion-implantation of energy of 20 keV thereby to form an amorphous silicon layer 121 in the active region of the silicon substrate 101. The amorphous silicon layer 121 has a thickness of approximately 70 nanometers. If the width of the opening formed in the field oxide film 111 is not less than 5 micrometers, then it is possible to use a photo-resist pattern for the above ion-implantation of Si. As described above the purpose of providing the amorphous silicon layer 121 is to suppress the channeling phenomenon in the ion-implantation of the conductive impurity.

As a modification, in place of the ion-implantation of Si, it is possible to carryout an ion-implantation of Ge at a dose of $1 \times 10^{18}$ cm$^{-3}$ at an ion-implantation of energy of 30 keV.

Figure 1B:
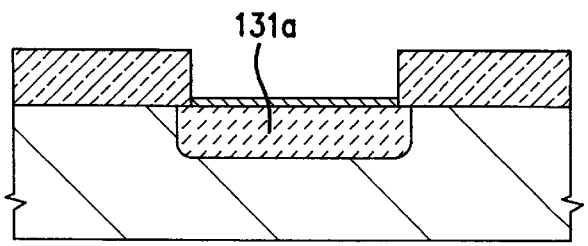

With reference to FIG. 1B, an ion-implantation of $BF_2$ into the amorphous silicon layer 121 is carried out at a dose of $1\times10^{15}$ cm$^{-3}$ at an ion-implantation of energy of 10 keV. At this time, a channeling phenomenon is suppressed. A heat treatment to the substrate is carried out at a temperature of 600° C. for one hour to cause the amorphous silicon layer 121 to be grown in solid phase into a crystal silicon layer whereby the amorphous silicon layer 121 is made into a p$^+$-type diffusion layer 131a is formed, which has a junction depth of approximately 50 nanometers. If the width of the opening is not less than 5 micrometers, it is preferable to use a photo-resist pattern for the ion-implantation of $BF_2$ by use of a photo-resist mask which covers the opening of the width of 5 micrometers. In this case, before the ion-implantation of $BF_2$ is carried out, another photo-resist mask is provided, which covers only an opening of a width of 0.2 micrometers but not cover the opening of the width of not less than 5 micrometers for subsequent ion-implantation of $BF_2$ at a dose of $2\times10^{15}$ cm$^{-3}$ at an ion-implantation of energy of 70 keV. At a heat treatment to the substrate is carried out to form a p+-type diffusion layer 131 which has a junction depth of approximately 0.2 micrometers.

The silicon oxide film 118 is not necessarily required, but which is preferably provided to protect the active region of the silicon substrate from contamination in the ion-implantation of $BF_2$. If the width of the opening is not less than 5 micrometers, it is preferable to provide the silicon oxide film 118 in order to avoid the photo-resist pattern from being made into contact with the silicon substrate. The crystal defects generated in forming the amorphous silicon are insufficiently recovered at this stage.

Figure 1C:
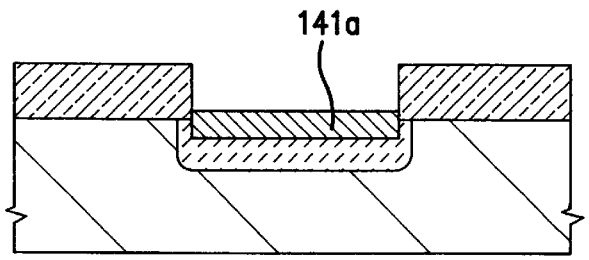

With reference to FIG. 1C, the silicon oxide film 118 is removed. A titanium film is entirely deposited by sputtering a titanium target. The titanium film has a thickness of approximately 20 nanometers and extends over the field oxide films 111 and the p+-type diffusion layer 131. The thickness of the titanium film is decided to be less than one half of the junction depth of the p+-type diffusion layer 131, and preferably one third of the junction depth of the p+-type diffusion layer 131a. A rapid thermal anneal to the substrate is carried out at a temperature of 700° C. for thirty seconds in an nitrogen atmosphere to form a titanium nitride film which extends over an entire surface of the titanium film. At the same time, the rapid thermal anneal causes a silicidation reaction of titanium and silicon over the p+-type diffusion layer 131a thereby forming a self-aligned C49 crystal phase titanium silicide film. The self-aligned C49 crystal phase titanium silicide film has a thickness of approximately 40 nanometers. A mixing solution of $H_2O_2$ and $NH_4OH$ is used to carry out a wet etching for selectively removal of unreacted titanium film residing over the field oxide films 111. A further rapid thermal annealing to the substrate is carried out at a temperature of 850° C. for ten seconds in an nitrogen atmosphere to cause a crystal phase transition from C49 to C54 thereby forming a C54 crystal phase titanium silicide film 141a over the p+-type diffusion layer 131. The crystal defects are not completely recovered and some crystal defects still reside.

By the way, it has been known in the art that the C54 crystal phase titanium silicide film 141 is subjected to a further heat treatment under conditions to cause a cohesion reaction whereby a roughness is formed on the surfaces of the C54 crystal phase titanium silicide film 141. It has also been known in the art that the this cohesion reaction may be caused by a heat treatment for a sufficiently long time at a lower temperature than that necessary for causing the crystal phase transition from C49 to C54. If the cohesion reaction is excessive, then the titanium silicide layer becomes a discontinuous island layer. A titanium salicide p+-type diffusion layer having the island C54 crystal phase titanium silicide layer has a sheet resistance which is higher by ten to a hundred times of a sheet resistance, for example, 6–7 Ω/□ of a titanium salicide p$^+$-type diffusion layer having a continuous C54 titanium silicide layer. By the way, non-salicide p+-type diffusion layer having a junction depth of approximately 50 nanometers and a width of 0.2 micrometers has a sheet resistance in the range of approximately 500–600 Ω/□. In the prior art, no cohesion reaction had been used or it had been try to avoid the use of any cohesion reaction.

In accordance with the present invention, however, the cohesion reaction is utilized to recover the crystal defects having been generated when the amorphous silicon layer was formed. Such cohesion reaction may be caused at a lower temperature than the temperature of the crystal phase transition of C49 into C54 of the titanium silicide layer, for which reason the crystal defects are not recovered by a simple supply of a thermal energy, but the crystal defects are recovered by movement of silicon atoms from the titanium silicide layer into the p$^+$-type diffusion layer 131a. The movement of silicon atoms is made by a vacancy-diffusion of lattice vacancy. Whether, by the cohesion reaction, the C54 crystal phase titanium silicide layer remains the continuous layer or becomes discontinuous island-like layer would depend upon a temperature and a time of the heat treatment by taking parameters of a line width and a thickness of the C54 crystal phase titanium silicide layer. When the C54 crystal phase titanium silicide layer has a line width of approximately 50 nanometers and a thickness of approximately 0.2 micrometers, then a temperature-time region of causing the cohesion reaction of the titanium silicide layer is shown in FIG. 2 as well as a temperature-time region of causing no disconnection of the titanium silicide layer is shown in FIG. 3.

Figure 1D:
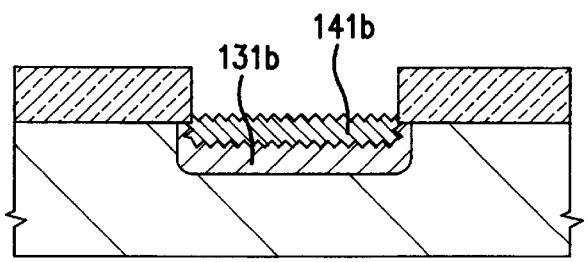

With reference to FIG. 1D, in consideration of the relationships shown in FIGS. 2 and 3, a heat treatment to the substrate is carried out at a temperature of 650° C. for 10 minutes to cause a cohesion reaction of the C54 crystal phase titanium silicide layer whereby the C54 crystal phase titanium silicide layer 141a having smooth surfaces becomes a C54 crystal phase titanium silicide layer 141b having rough surfaces. At the same time, almost all of the crystal defects having been generated in forming the amorphous silicon layer are recovered, particularly crystal defects on the p$^+$-n junction surface are well recovered. The surfaces of the C54 crystal phase titanium silicide layer 141b are rough but not discontinuous. The p$^+$-n junction depth almost remains unchanged by this heat treatment carried out to cause the cohesion reaction of the titanium silicide layer. From FIGS. 2 and 3, it can been understood that the temperature and time of the heat treatment for causing the cohesion reaction are determined to comply with both a condition for causing the cohesion reaction and a condition for causing no disconnection of the titanium silicide layer. If it were tried to cause both the crystal phase transition from C49 to C54 of the titanium silicide layer and the cohesion reaction of the titanium silicide layer, then the disconnected C54 crystal phase titanium silicide layer with discontinuous and island-like surfaces is formed. For this reason, it is required to carry out separately two heat treatments for causing the crystal phase transition of C49 to C54 of the titanium silicide layer and subsequent causing the cohesion reaction of the C54 crystal phase titanium silicide layer.

As described above, according to the design requirement, a p$^+$-type diffusion layer of a width of not less than 5 micrometers is required, then no amorphous silicon is formed and an ion-implantation of $BF_2$ is carried out to form a p$^+$-type diffusion layer under different conditions for ion-implantation of $BF_2$ which was used to form the p$^+$-type diffusion layer 13a. If a heat treatment is carried out at a temperature of 650° C. for ten minutes, then no cohesion reaction is caused on the self-aligned C54 crystal phase titanium silicide layer, for which reason it is required to previously form the p+-type diffusion layer having the junction depth which is deeper than the junction depth of the p+-type diffusion layer 131a so as to prevent any formation of amorphous silicon.

Figure 1E:
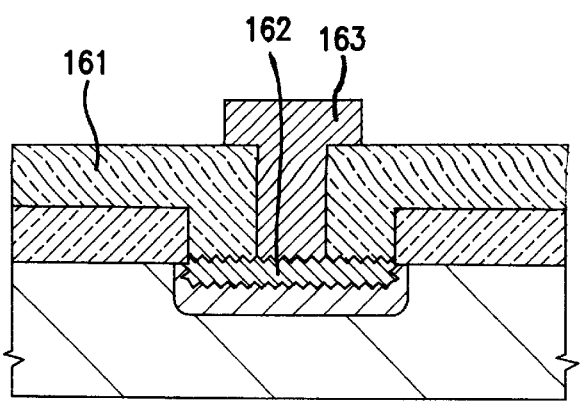

With reference to FIG. 1E, an inter-layer insulator 161 is entirely deposited by a chemical vapor deposition over the field oxide films 111 and over the cohered C54 crystal phase titanium silicide layer 141b. The inter-layer insulator 161 has a thickness of approximately 0.6 micrometers. A contact hole 162 is formed in the inter-layer insulator 161 and over the cohered C54 crystal phase titanium silicide layer 141b so that a part of the cohered C54 crystal phase titanium silicide layer 141b is shown through the contact hole 162. The contact hole 162 has a diameter of approximately 0.12 micrometers. It may be possible that for the purpose of forming a wide contact hole 162, the width of the p$^+$-type diffusion layer 131a is more than 0.2 micrometers. A metal interconnection 163 made of, for example, aluminum alloy is then formed within the contact hole and over the inter-layer insulator 161 in the vicinity of the contact hole 162.

The above semiconductor device has the titanium salicide structure wherein the p$^+$-type diffusion layer has a p$^+$-n junction depth of approximately 50 nanometers. The measured p$^+$-n junction leakage current is approximately 50 pA/mm$^2$. The p$^+$-type diffusion layer has an effective sheet resistance of 6–7 $\Omega$/□. As a result, the reduced sheet resistance is kept while suppressing any increase in p$^+$-n junction leakage. The above fabrication method is applicable to a semiconductor device required to be scaled down less than 0.25 micrometers.

It is preferable that the depth of the amorphous silicon layer 121 is deeper by 1.2 to 1.5 times than the junction depth of the p$^+$-diffusion layer 131a. If the amorphous silicon layer 121 is too shallow, then it is difficult to suppress sufficiently the channeling phenomenon in forming the p+-type diffusion layer 131a. As a result, the depth of the p$^+$-diffusion layer 131a is deeper than an intended depth thereby reducing the effect of the amorphous silicon layer 121 is. If, however, the amorphous silicon layer 121 too deep, then it is difficult to recover crystal defects even by carrying out the heat treatment for causing the cohesion reaction of the titanium silicide film 141a to make the titanium silicide film 141a into the titanium silicide film 141b.

The above fabricating method is applicable to formation of a p$^+$- type emitter layer in a p-n-p bipolar transistor. The above fabricating method is also applicable to formation of an n$^+$-type shallow junction diffusion layer with a salicide structure. In this case, the n$^+$-type shallow junction diffusion layer is formed over a p-type silicon substrate and a p-well region over the n-type silicon substrate. If the n$^+$-type shallow junction diffusion layer has a width of approximately 0.2 micrometers and a junction depth of approximately 50 nanometers, the amorphous silicon layer is formed under the same conditions as the first embodiment according to the present invention. In place of the ion-implantation of $BF_2$ at an ion-implantation energy of 10 keV and a dose of $1 \times 10^{15}$ cm$^{-2}$, an ion-implantation of As is carried out at an ion-implantation energy of 15 keV and a dose of $1 \times 10^{15}$ cm$^{-2}$. If, in accordance with the design requirement, the n+-type diffusion layer is required to have a width wider than 5 micrometers, then in place of the ion-implantation of $BF_2$ at an ion-implantation energy of 70 keV and a dose of $3 \times 10^{15}$ cm$^{-2}$, an ion-implantation of As is carried out at an ion-implantation energy of 70 keV and a dose of $3 \times 10^{15}$ cm$^{-2}$.

For the above present invention, it is important that the heat treatment is carried out to cause the cohesion reaction of the titanium silicide layer in order to recover the crystal defects particularly on the p-n junction in the substrate. If no cohesion reaction is utilized to recover the crystal defects, it is necessary to carry out a heat treatment at a temperature of about 1100° C., whereby it is, however, difficult to form a shallow diffusion layer. It is further important for the present invention to avoid the titanium silicide layer from being disconnected or being made into discontinuous islands when the heat treatment is carried out for causing the cohesion reaction.

A second embodiment according to the present invention will be described with reference to FIGS. 4A through 4G which are illustrative of a method of forming a p-channel MOS field effect transistor having titanium salicide shallow junction source/drain diffusion layers and a titanium polyside gate electrode of a short gate length.

Figure 4A:
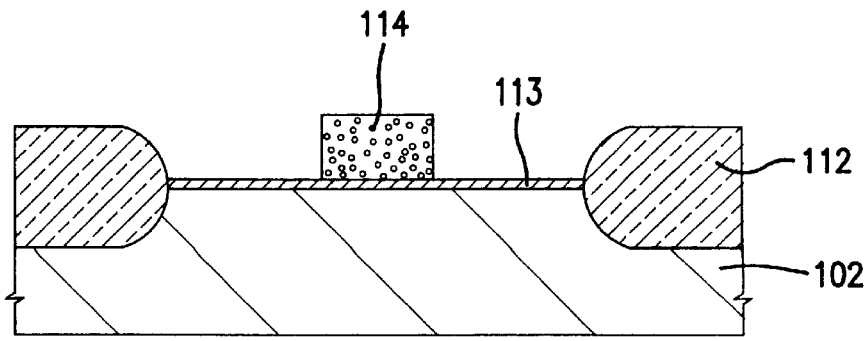
FIGS. 4A through 4G are fragmentary cross sectional elevation views illustrative of a method of forming a semiconductor substrate on which a titanium salicide shallow junction diffusion layer is formed in a second embodiment according to the present invention.

With reference to FIG. 4A, an n-type silicon substrate 102 is prepared, which has an impurity concentration of $1 \times 10^{17}$ cm$^{-3}$. Field oxide films 112 are selectively formed over a surface of the n-type silicon substrate 1 by a local oxidation of silicon method. The field oxide films 112 has a thickness of 0.2 micrometers. An active region of the silicon substrate 102 is defined by the field oxide films 112. A thermal oxidation of silicon is carried out to form a gate oxide film 113 over the active region of the silicon substrate 102. The gate oxide film 113 has a thickness of approximately 9 nanometers. A width of the active region is approximately 750 nanoemters.

As a modification, in place of the n-type silicon substrate 102, it is possible that an n-well region having an impurity concentration of $1 \times 10^{17}$ cm$^{-3}$ is formed in an upper region of a p-type silicon substrate having an impurity concentration of $1 \times 10^{15}$ cm$^{-3}$.

Subsequently, an undoped polysilicon film having a thickness of approximately 200 nanometers is entirely formed, which extends over the gate oxide film 113 and the field oxide films 112. The undoped polysilicon film is then patterned to form an undoped polysilicon film pattern 114 over the gate oxide film 114. The undoped polysilicon film pattern 114 has a line width of 0.2 micrometers.

Figure 4B:
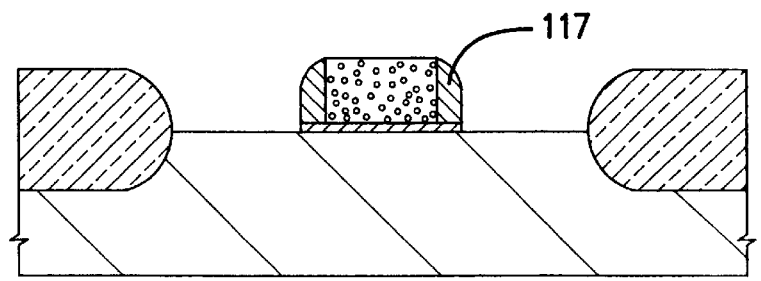

With reference to FIG. 4B, an insulation film made of either silicon oxide or silicon nitride is entirely deposited for etch back by subsequent anisotropic etching to remove the insulation film except on side walls of the undoped polysilicon film pattern 114 thereby forming side wall oxide films 117 on the side walls of the undoped polysilicon film pattern 114.

Figure 4C:
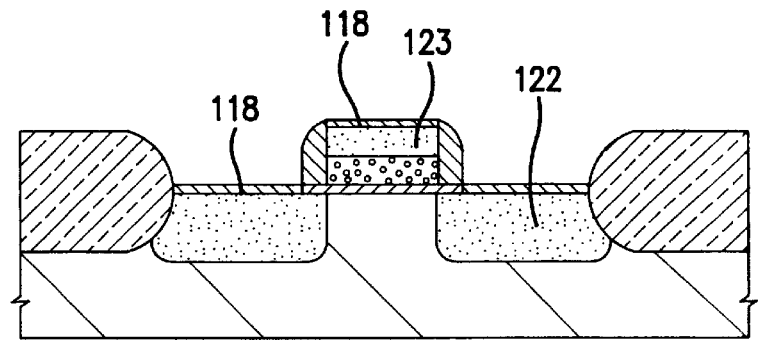

With reference to FIG. 4C, a thermal oxidation of silicon is carried out to form silicon oxide films 118 over the gate electrode 114 and over the active region of the silicon substrate 102 except under the gate electrode and the side wall oxide films 117. The silicon oxide films 118 have a thickness of approximately 10 nanometers. An ion-implantation of Si is carried out at a dose of $1 \times 10^{15}$ cm$^{-2}$ and an ion-implantation energy of 20 keV by use of the field oxide films 112 and the side wall oxide films 117 as masks to form self-aligned amorphous silicon layers 122 having a depth of approximately 70 nanometers in an upper region of the silicon substrate 102 as well as form an amorphous silicon layer 123 in an upper region of the undoped polysilicon film pattern 114. As compared to the n-type silicon substrate 102, the channeling phenomenon is unlikely to appear on the undoped polysilicon film pattern 114, for which reason the amorphous silicon layer 123 has a slightly shallower depth than the self-aligned amorphous silicon layers 122.

As a modification, in place of the ion-implantation of silicon, it is possible to carry out an ion-implantation of Ge at a dose of $1\times10^{15}$ cm$^{-2}$ and an ion-implantation energy of 30 keV.

Figure 4D:
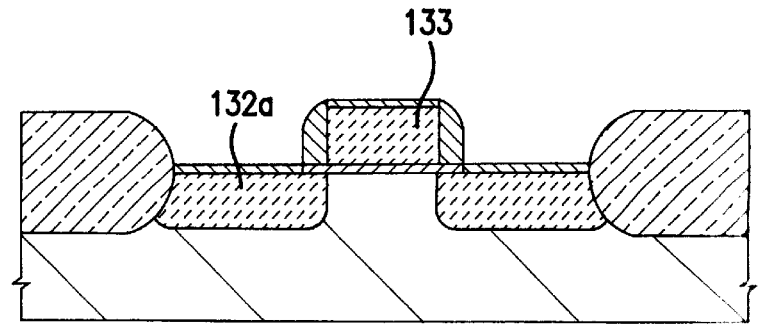

With reference to FIG. 4D, an ion-implantation of BF$_2$ is carried out at a dose of $1\times10^{15}$ cm$^{-2}$ and an ion-implantation energy of 10 keV for subsequent heat treatment at a temperature of 600° C. for one hour thereby to form p$^+$-type diffusion layers 132a having a junction depth of 50 nanometers in an upper region of the n-type silicon substrate 102. As a result, both the amorphous silicon layer 123 and the remaining undoped polysilicon film pattern 114 are made into a p$^+$-type polysilicon pattern 133. The p$^+$-type diffusion layers 132a have a width of approximately 0.2 micrometers. The p$^+$-type polysilicon pattern 133 has a thickness of 200 nanometers which is larger than a junction depth of p+-type diffusion layers 132a. Since, however, a diffusion rate of a conductive impurity in the polysilicon film is sufficiently large, it is possible to form the polysilicon film pattern 133.

As a modification, according to the design requirement, either a p$^+$-type diffusion layer of a width of not less than 5 micrometers or a titanium polyside interconnection is required, then no amorphous silicon is formed and an ion-implantation of BF$_2$ is carried out to form a p$^+$-type diffusion layer under different conditions for ion-implantation of BF$_2$ which was used to form the p$^+$-type diffusion layer 132a. If a heat treatment is carried out at a temperature of 650° C. for ten minutes, then no cohesion reaction is caused on the self-aligned C54 crystal phase titanium silicide layer, for which reason it is required to previously form the p+type diffusion layer having the junction depth which is deeper than the junction depth of the p+-type diffusion layer 131a so as to prevent any formation of amorphous silicon.

Figure 4E:
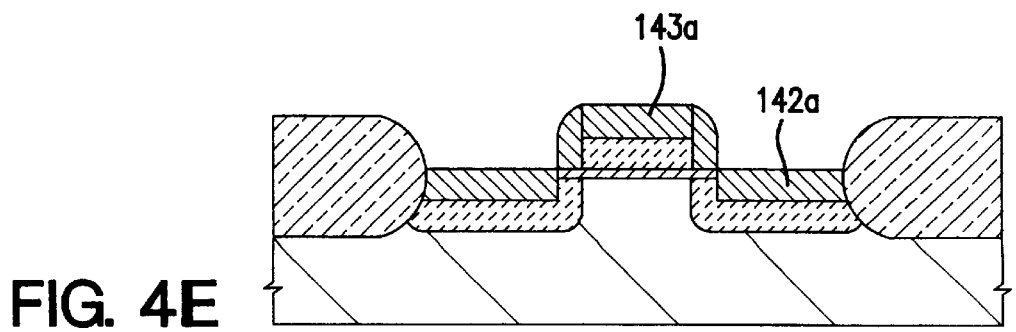

With reference to FIG. 4E, the silicon oxide films 118 are removed before a titanium film is entirely deposited, which has a thickness of 20 nanometers. A rapid thermal anneal is carried out at a temperature of 700° C. for 30 seconds in a nitrogen atmosphere whereby a titanium nitride film is formed on an entire surface of the titanium film as well as self-aligned C49 crystal phase titanium silicide layers are formed over the p$^+$-type diffusion layers 132a and over the undoped polysilicon film pattern 133. A mixing solution of hydrogen peroxide with ammonium is used for a wet etching to selectively remove the titanium nitride film and the unreacted titanium film. A rapid thermal anneal is carried out at a temperature of 850° C. for 10 seconds to cause a crystal phase transition of C49 to C54 whereby the self-aligned C49 crystal phase titanium silicide layers are made into C54 crystal phase titanium silicide layers 142a and 143a. Namely, the C54 crystal phase titanium silicide layers 142a are formed in upper regions of the p$^+$-type diffusion layers 132a as well as the C54 crystal phase titanium silicide layer 143a is formed in an upper region of the undoped polysilicon film pattern 133.

Figure 4F:
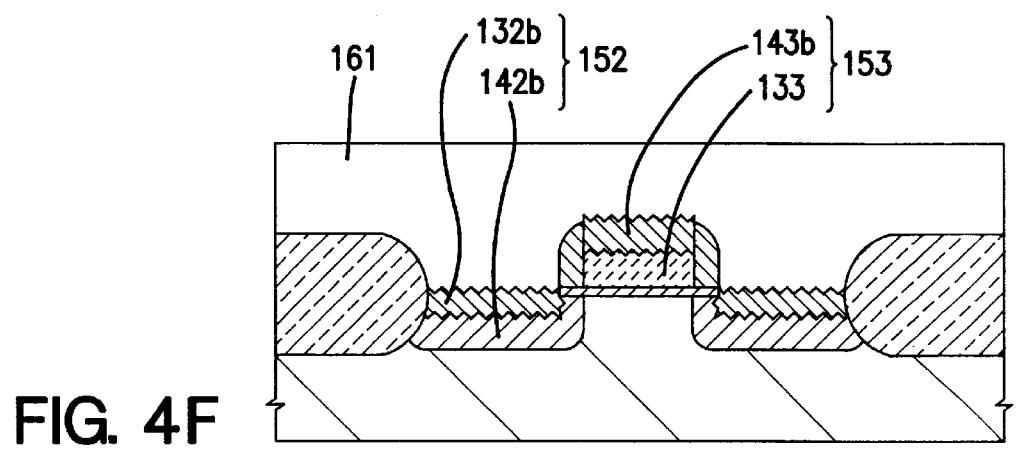

With reference to FIG. 4F, an inter-layer insulator 161 is entirely formed by a chemical vapor deposition over the field oxide films 112 and the C54 crystal phase titanium silicide layers 142a and 143a. The interlayer insulator 161 is made of silicon oxide and has a thickness of approximately 0.6 micrometers. A heat treatment is carried out at a temperature of 650° C. for 10 minutes to cause a cohesion reaction of the C54 crystal phase titanium silicide layers 142a and 143a so that the C54 crystal phase titanium silicide layers 142a and 143a are made into the cohered C54 crystal phase titanium silicide layers 142b and 143b as well as the p$^+$-type diffusion layers 132a are made into the cohered p$^+$-type diffusion layers 132b. As a result, formations are made for titanium salicide source/drain diffusion layers 152 comprising the p$^+$-type diffusion layers 132a and the cohered C54 crystal phase titanium silicide layers 142b. A further formation is made for a titanium polyside gate electrode 153 comprising the undoped polysilicon film pattern 133 and the cohered C54 crystal phase titanium silicide layer 143b. As a result, the p-channel MOS field effect transistor is made.

As a modification, it is possible to have carried out the heat treatment for causing the cohesion reaction before the inter-layer insulator 161 is formed.

Figure 4G:
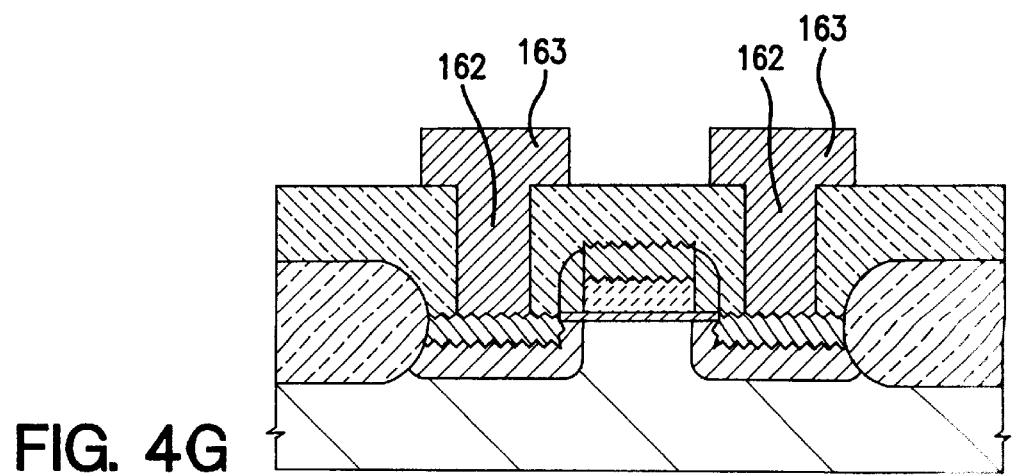

With reference to FIG. 4G, contact holes 162 are formed in the inter-layer insulator 161 and over the cohered C54 crystal phase titanium silicide layers 142b so that parts of the cohered C54 crystal phase titanium silicide layers 142b are shown through the contact holes 162. The contact holes 162 have a diameter of approximately 0.12 micrometers. It may be possible that for the purpose of forming wide contact holes 162, the width of the p$^+$-type diffusion layers 131a is more than 0.2 micrometers. Metal interconnections 163 made of, for example, aluminum alloy are then formed within the contact hole and over the inter-layer insulator 161 in the vicinity of the contact holes 162.

The above semiconductor device has substantially the same effect as in the first embodiment. It is further possible to suppress any increase in sheet resistance of the titanium polyside gate structure. The above fabrication method is applicable to the n-channel MOS field effect transistor. For the above present invention, it is important that the heat treatment is carried out to cause the cohesion reaction of the titanium silicide layer in order to recover the crystal defects particularly on the p-n junction in the substrate. If no cohesion reaction is utilized to recover the crystal defects, it is necessary to carry out a heat treatment at a temperature of about 1100° C., whereby it is, however, difficult to form a shallow diffusion layer. It is further important for the present invention to avoid the titanium silicide layer from being disconnected or being made into discontinuous islands when the heat treatment is carried out for causing the cohesion reaction.

A third embodiment according to the present invention will be described with reference to FIGS. 5A through 5G which are illustrative of a method of forming a CMOS field effect transistors having titanium salicide shallow junction source/drain diffusion layers and titanium polyside gate electrodes of a short gate length.

Figure 5A:
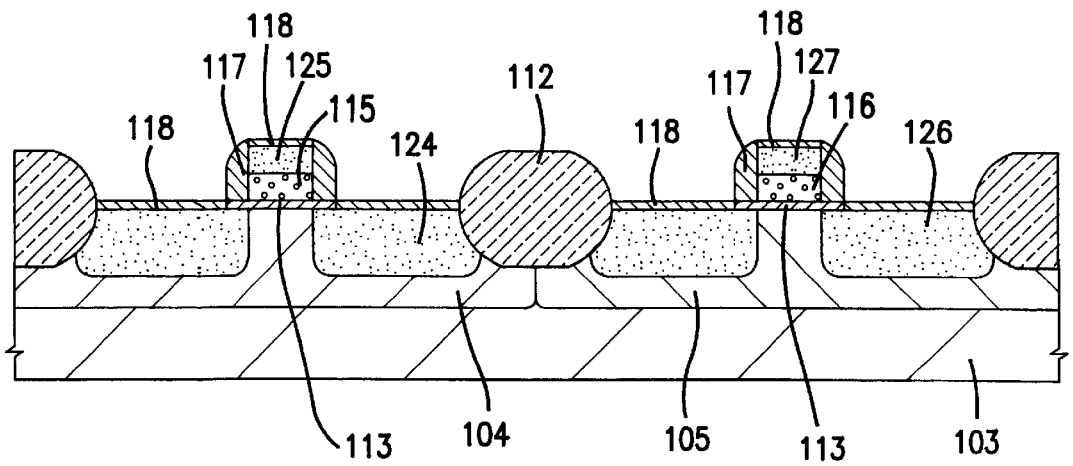
FIGS. 5A through 5G are fragmentary cross sectional elevation views illustrative of a method of forming a semiconductor substrate on which a titanium salicide shallow junction diffusion layer is formed in a third embodiment according to the present invention.

With reference to FIG. 5A, a p-type silicon substrate 103 is prepared, which has an impurity concentration of $5\times10^{15}$ cm$^{-3}$. A p-type well region 104 and an n-type well region 105 are formed in an upper region of the silicon substrate 103. The p-type well region 104 and the n-type well region 105 have a junction depth of approximately 1.2 micrometers and an impurity concentration of approximately $5\times10^{15}$ cm$^{-3}$. Field oxide films 112 are selectively formed over a surface of the n-type silicon substrate 1 by a local oxidation of silicon method. The field oxide films 112 has a thickness of 0.2 micrometers. An active region of the silicon substrate 102 is defined by the field oxide films 112. A thermal oxidation of silicon is carried out to form a gate oxide film 113 over the active region of the silicon substrate 102. The gate oxide film 113 has a thickness of approximately 9 nanometers. A width of the active region is approximately 750 nanoemters.

As a modification, in place of the p-type silicon substrate 103, it is possible that an n-type silicon substrate having an impurity concentration of $5\times10^{157}$ cm$^{-3}$ is formed.

Subsequently, an undoped polysilicon film having a thickness of approximately 200 nanometers is entirely formed, which extends over the gate oxide film 113 and the field oxide films 112. The undoped polysilicon film is then patterned to form undoped polysilicon film patterns 115 and 116 over the gate oxide film 113. The undoped polysilicon film patterns 115 and 116 have a line width of 0.2 micrometers.

An insulation film having a thickness of approximately 70 micrometers and being made of either silicon oxide or silicon nitride is entirely deposited for etch back by subsequent anisotropic etching to remove the insulation film except on side walls of the undoped polysilicon film patterns 115 and 116 thereby forming side wall oxide films 117 on the side walls of the undoped polysilicon film patterns 115 and 116.

A thermal oxidation of silicon is carried out to form silicon oxide films 118 over the undoped polysilicon film patterns 115 and 116 and over the active region of the n-type and p-type well regions 103 and 104 except under the undoped polysilicon film patterns 115 and 116 and except under the side wall oxide films 117. The silicon oxide films 118 have a thickness of approximately 10 nanometers. An ion-implantation of Si is carried out at a dose of $1\times10^{15}$ cm$^{-2}$ and an ion-implantation energy of 20 keV by use of the field oxide films 112 and the side wall oxide films 117 as masks to form self-aligned amorphous silicon layers 124 in the p-type well region 104 and self-aligned amorphous silicon layers 126 in the n-type well region 103. The self-aligned amorphous silicon layers 124 and 126 have a depth of approximately 70 nanometers as well as form an amorphous silicon layer 125 in an upper region of the undoped polysilicon film pattern 115 and an amorphous silicon layer 127 in an upper region of the undoped polysilicon film pattern 116.

As a modification, in place of the ion-implantation of silicon, it is possible to carry out an ion-implantation of Ge at a dose of $1\times10^{15}$ cm$^{-2}$ and an ion-implantation energy of 30 keV.

Figure 5B:
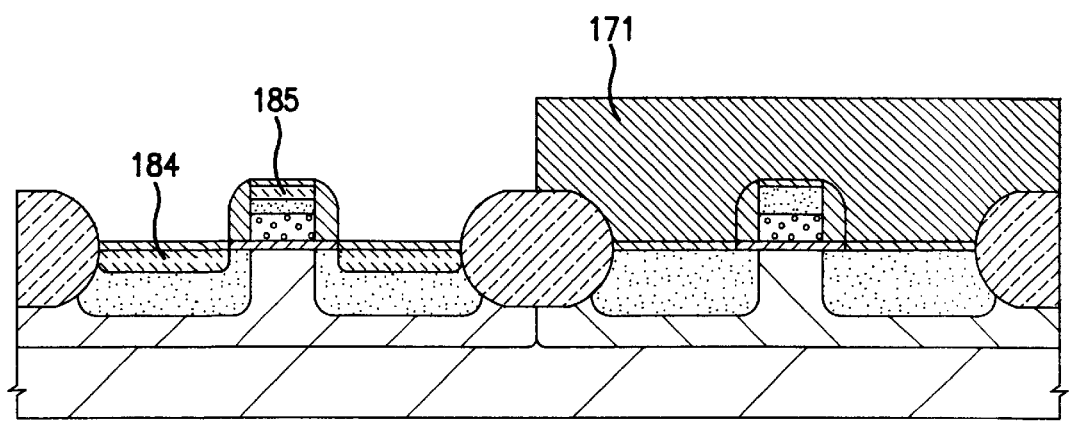

With reference to FIG. 5B, a photo-resist mask 171 is provided which covers the n-well region 103. An ion-implantation of As is carried out at a dose of $1\times10^{15}$ cm$^{-2}$ and an ion-implantation energy of 15 keV by use of the photo-resist pattern as a mask. As a result, n-type ion-implanted regions 184 and 185 are formed.

Figure 5C:
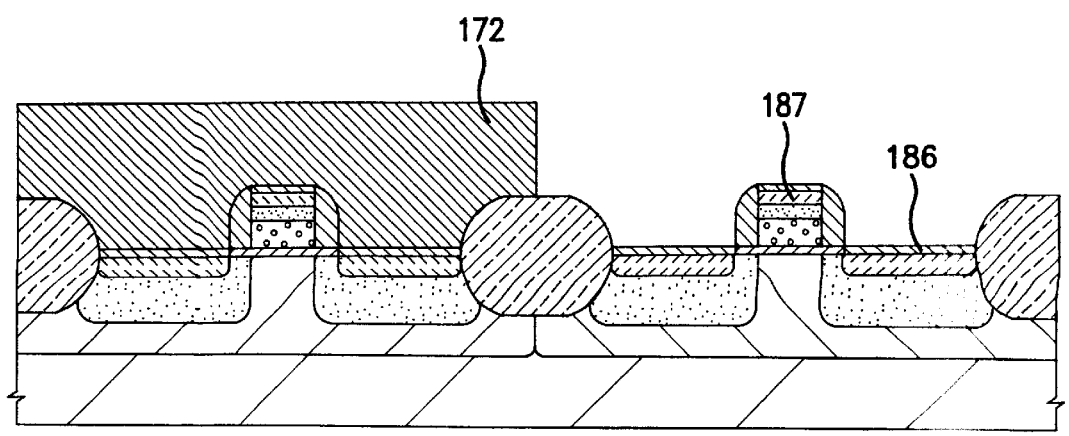
Figure 5D:
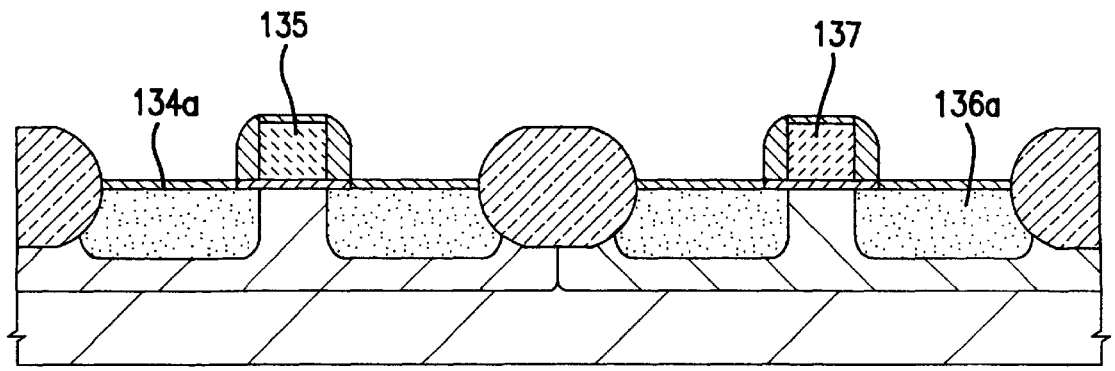

With reference to FIG. 5C, after the photo-resist mask 171 was removed, another photo-resisi: mask 172 is provided which covers the pwell region 104. An ion-implantation of BF$_2$ is carried out at a dose of $1\times10^{15}$ cm$^{-2}$ and an ion-implantation energy of 10 keV by use of the photoresist pattern as a mask. As a result, p-type ion-implanted regions 186 and 187 are formed.

With reference to FIG. SD, a heat treatment is carried out at a temperature of 600° C. for one hour thereby to form n$^+$-type diffusion layers 134a having a junction depth of 50 nanometers in the p-type well region 104 as well as p$^+$-type diffusion layers 136a having a junction depth of 50 nanometers in the n-well region 103. As a result, both the amorphous silicon layer 125 and the remaining undoped polysilicon film pattern 115 are made into an n$^+$-type polysilicon pattern 135. Further, both the amorphous silicon layer 127 and the remaining undoped polysilicon film pattern 116 are made into a p$^+$-type polysilicon pattern 137. It is not preferable that the heat treatment is carried out immediately after the n-type ion implantation layers 184 and 185 have been formed. If, however, the heat treatment is carried out immediately after the n-type ion implantation layers 184 and 185 have been formed, then the crystallization of the amorphous silicon layers 126 and 127 are progressed whereby it is difficult to form the shallow p$^+$-type diffusion layer 136a.

Figure 5E:
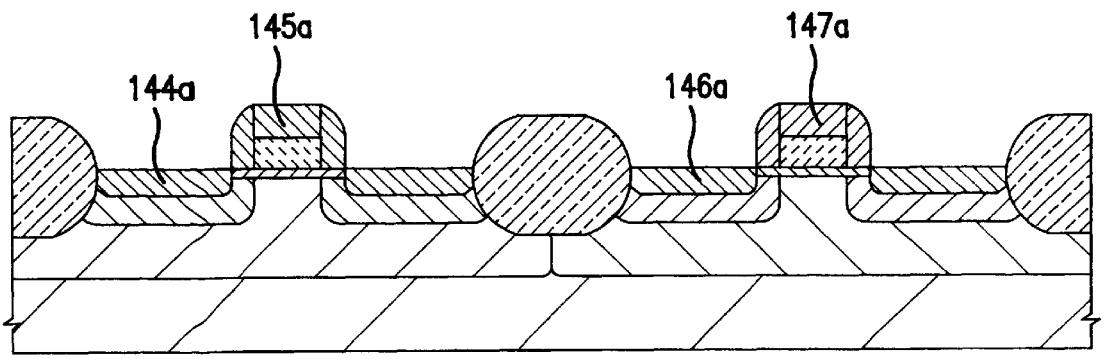

With reference to FIG. 5E, the silicon oxide films 118 are removed before a titanium film is entirely deposited, which has a thickness of 20 nanometers. A rapid thermal anneal is carried out at a temperature of 700° C. for 30 seconds in a nitrogen atmosphere whereby a titanium nitride film is formed on an entire surface of the titanium film as well as self-aligned C49 crystal phase titanium silicide layers are formed over the n$^+$-type diffusion layers 134a and the p$^+$-type diffusion layers 136a as well as over the undoped polysilicon film patterns 135 and 137. A mixing solution of hydrogen peroxide with ammonium is used for a wet etching to selectively remove the titanium nitride film and the unreacted titanium film. A rapid thermal anneal is carried out at a temperature of 850° C. for 10 seconds to cause a crystal phase transition of C49 to C54 whereby the self-aligned C49 crystal phase titanium silicide layers are made into C54 crystal phase titanium silicide layers 144a and 145a. Namely, the C54 crystal phase titanium silicide layers 144a are formed in upper regions of the n$^+$-type diffusion layers 134a as well as the C54 crystal phase titanium silicide layer 145a is formed in an upper region of the undoped polysilicon film pattern 135. The C54 crystal phase titanium silicide layers 146a are formed in upper regions of the p$^+$-type diffusion layers 136a as well as the C54 crystal phase titanium silicide layer 147a is formed in an upper region of the undoped polysilicon film pattern 137.

Figure 5F:
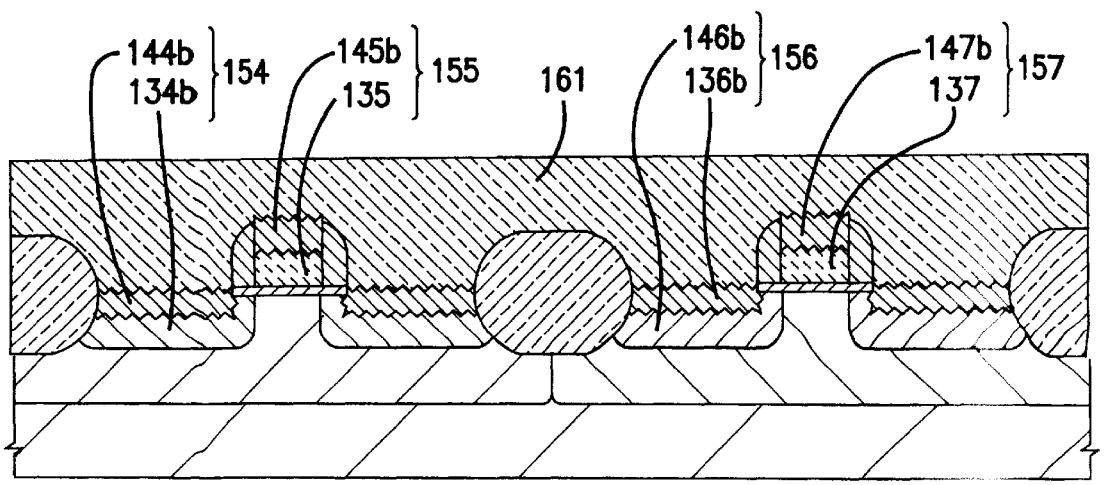

With reference to FIG. 5F, an inter-layer insulator 161 is entirely formed by a chemical vapor deposition. The inter-layer insulator 161 is made of silicon oxide and has a thickness of approximately 0.6 micrometers. A heat treatment is carried out at a temperature of 650° C. for 10 minutes to cause a cohesion reaction of the C54 crystal phase titanium silicide layers 144a, 145a, 146a and 147a so that the C54 crystal phase titanium silicide layers 144a, 145a, 146a and 147a are made into the cohered C54 crystal phase titanium silicide layers 144b, 145b, 146b and 147b. At the same time, the n$^+$-type diffusion layers 134a are made into the n$^+$-type diffusion layers 134b. The p$^+$-type diffusion layers 136a are made into the p$^+$-type diffusion layers 136b. As a result, formations are made for titanium salicide source/drain diffusion layers 154 comprising the n$^+$-type diffusion layers 134a and the cohered C54 crystal phase titanium silicide layers 144b. A further formation is made for a titanium polyside gate electrode 155 comprising the n$^+$-doped polysilicon film pattern 135 and the cohered C54 crystal phase titanium silicide layer 145b. Formations are made for titanium salicide source/drain diffusion layers 156 comprising the p$^+$-type diffusion layers 136a and the cohered C54 crystal phase titanium silicide layers 146b. A further formation is made for a titanium polyside gate electrode 157 comprising the p$^+$-doped polysilicon film pattern 137 and the cohered C54 crystal phase titanium silicide layer 147b. As a result, the CMOS field effect transistors are made.

As a modification, it is possible to have carried out the heat treatment for causing the cohesion reaction before the inter-layer insulator 161 is formed.

Figure 5G:
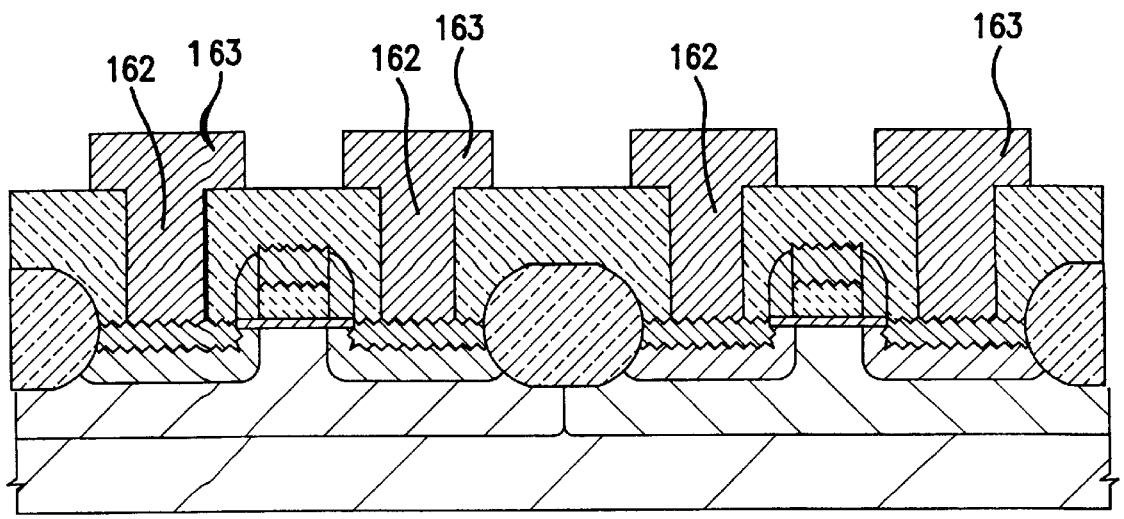

With reference to FIG. 5G, contact holes 162 are formed in the inter-layer insulator 161 and over the cohered C54 crystal phase titanium silicide layers 144b and 146b so that parts of the cohered C54 crystal phase titanium silicide layers 144b and 146b are shown through the contact holes 162. The contact holes 162 have a diameter of approximately 0.12 micrometers. It may be possible that for the purpose of forming wide contact holes 162, the width of the p$^+$-type diffusion layers 131a is more than 0.2 micrometers. Metal interconnections 163 made of, for example, aluminum alloy are then formed within the contact hole and over the interlayer insulator 161 in the vicinity of the contact holes 162.

The above semiconductor device has substantially the same effect as in the second embodiment. It is therefore possible to suppress any increase in sheet resistance of the titanium polyside gate structure. The above fabrication method is applicable to the Bi-CMOS device.

For the above present invention, it is important that the heat treatment is carried out to cause the cohesion reaction of the titanium silicide layer in order to recover the crystal defects particularly on the p-n junction in the substrate. If no cohesion reaction is utilized to recover the crystal defects, it is necessary to carry out a heat treatment at a temperature of about 1100° C., whereby it is, however, difficult to form a shallow diffusion layer. It is further important for the present invention to avoid the titanium silicide layer from being disconnected or being made into discontinuous islands when the heat treatment is carried out for causing the cohesion reaction.

Figure 6A:
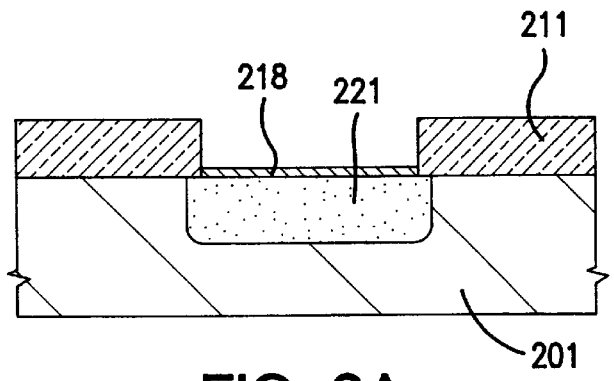
FIGS. 6A through 6G are fragmentary cross sectional elevation views illustrative of a method of forming a semiconductor substrate on which a titanium salicide shallow junction diffusion layer is formed in a fourth embodiment according to the present invention.

A fourth embodiment according to the present invention will be described in detail with reference to FIGS. 6A through 6G, wherein a cohesion reaction of the titanium silicide layer is caused to form island-like or disconnected titanium silicide layers With reference to FIG. 6A, an n-type silicon substrate 201 is prepared, which has an impurity concentration of approximately $1 \times 10^{17}$ cm$^{-3}$. A field oxide film 211 is formed over the n-type silicon substrate 1. The field oxide film 211 has a thickness of 0.2 micrometers. An opening is formed in the field oxide film 211 whereby an active region of the n-type silicon substrate 201 is shown through the opening. A thermal oxidation to the active region of the n-type silicon substrate 201 is carried out to form a silicon oxide film 218 over the active region of the n-type silicon substrate 201. The silicon oxide film 218 has a thickness of approximately 10 nanometers. Namely, a width of the opening is 0.2 micrometers. It is possible that in accordance with the design requirement, the width of the opening is not less than 5 micrometers.

As a modification, in place of the n-type silicon substrate 201, it is possible to form an n-well region having an impurity concentration of $1 \times 10^{17}$ cm$^{-3}$ in an upper region of a p-type silicon substrate having an impurity concentration of $1 \times 10^{15}$ cm$^{-3}$ before a field oxide film is formed over the n-well region and the p-type silicon substrate for subsequent formation of an opening in the field oxide film so that an active region of the n-well region is shown through the opening.

The description will be returned to the first embodiment of the present invention. An ion-implantation of Si into the active region is carried out by use of the field oxide films 211 as a mask at a dose of $1 \times 10^{15}$ cm$^{-3}$ at an ion-implantation of energy of 20 keV thereby to form an amorphous silicon layer 221 in the active region of the silicon substrate 201. The amorphous silicon layer 221 has a thickness of approximately 70 nanometers. If the width of the opening formed in the field oxide film 211 is not less than 2 micrometers, then it is possible to use a photo-resist pattern for the above ion-implantation of Si. As described above the purpose of providing the amorphous silicon layer 221 is to suppress the channeling phenomenon in the ion-implantation of the conductive impurity.

As a modification, in place of the ion-implantation of Si, it is possible to carryout an ion-implantation of Ge at a dose of $1 \times 10^{18}$ cm$^{-3}$ at an ion-implantation of energy of 30 keV.

Figure 6B:
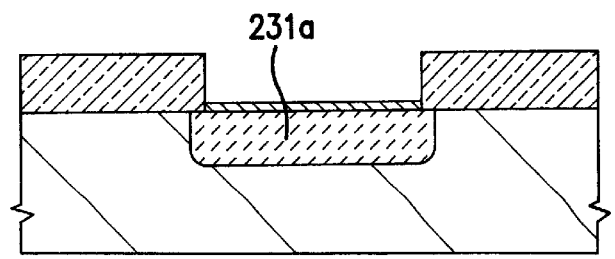

With reference to FIG. 6B, an ion-implantation of BF$_2$ into the amorphous silicon layer 221 is carried out at a dose of $1 \times 10^{15}$ cm$^{-3}$ at an ion-implantation of energy of 10 keV. At this time, a channeling phenomenon is suppressed. A heat treatment to the substrate is carried out at a temperature of 600° C. for one hour to cause the amorphous silicon layer 221 to be grown in solid phase into a crystal silicon layer whereby the amorphous silicon layer 221 is made into a p$^+$-type diffusion layer 231a is formed, which has a junction depth of approximately 50 nanometers. If the width of the opening is not less than 2 micrometers, it is preferable to use a photo-resist pattern for the ion-implantation of BF$_2$ by use of a photo-resist mask which covers the opening of the width of 2 micrometers. In this case, before the ion-implantation of BF$_2$ is carried out, another photo-resist mask is provided, which covers only an opening of a width of 0.2 micrometers but not cover the opening of the width of not less than 2 micrometers for subsequent ion-implantation of BF$_2$ at a dose of $2 \times 10^{15}$ cm$^{-3}$ at an ion-implantation of energy of 70 keV. At a heat treatment to the substrate is carried out to form a p+-type diffusion layer 231 which has a junction depth of approximately 0.2 micrometers.

The silicon oxide film 218 is not necessarily required, but which is preferably provided to protect the active region of the silicon substrate from contamination in the ion-implantation of BF$_2$. If the width of the opening is not less than 2 micrometers, it is preferable to provide the silicon oxide film 218 in order to avoid the photo-resist pattern from being made into contact with the silicon substrate. The crystal defects generated in forming the amorphous silicon are insufficiently recovered at this stage.

Figure 6C:
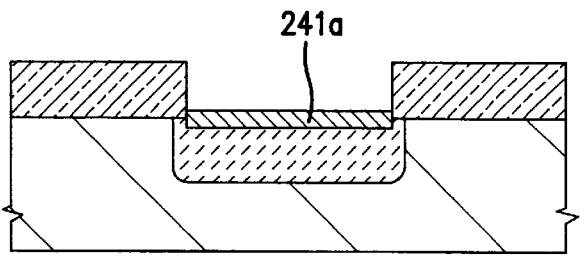

With reference to FIG. 6C, the silicon oxide film 218 is removed. A titanium film is entirely deposited by sputtering a titanium target. The titanium film has a thickness of approximately 5 nanometers and extends over the field oxide films 211 and the p+-type diffusion layer 231. The thickness of the titanium film is decided to be less than one half of the junction depth of the p+-type diffusion layer 231, and preferably one third of the junction depth of the p+-type diffusion layer 231a. A rapid thermal anneal to the substrate is carried out at a temperature of 700° C. for thirty seconds in an nitrogen atmosphere to form a titanium nitride film which extends over an entire surface of the titanium film. At the same time, the rapid thermal anneal causes a silicidation reaction of titanium and silicon over the p+-type diffusion layer 231a thereby forming a self-aligned C49 crystal phase titanium silicide film. The self-aligned C49 crystal phase titanium silicide film has a thickness of approximately 40 nanometers. A mixing solution of H$_2$O$_2$ and NH$_4$OH is used to carry out a wet etching for selectively removal of unreacted titanium film residing over the field oxide films 211. A further rapid thermal annealing to the substrate is carried out at a temperature of 850° C. for ten seconds in an nitrogen atmosphere to cause a crystal phase transition from C49 to C54 thereby forming a C54 crystal phase titanium silicide film 241a over the p+-type diffusion layer 231. The crystal defects are not completely recovered and some crystal defects still reside.

Figure 6D:
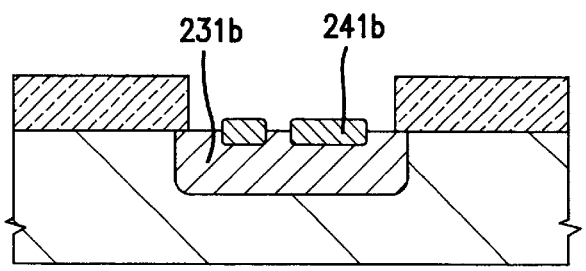

With reference to FIG. 6D, a heat treatment to the substrate is carried out at a temperature of 950° C. for 10 minutes to cause a cohesion reaction of the C54 crystal phase titanium silicide layer whereby the C54 crystal phase titanium silicide layer 241a having smooth surfaces becomes a C54 crystal phase titanium silicide layer 241b having discontinuous or island-like surfaces. At the same time, almost all of the crystal defects having been generated in forming the amorphous silicon layer are recovered, particularly crystal defects on the p+-n junction surface are well recovered. The surfaces of the C54 crystal phase titanium silicide layer 241b are rough but like island or discontinued. The p$^+$-n junction depth almost remains unchanged by this heat treatment carried out to cause the cohesion reaction of the titanium silicide layer. From FIGS. 2 and 3, it can been understood that the temperature and time of the heat treatment for causing the cohesion reaction are determined to comply with a condition for causing the cohesion reaction and a condition for causing a disconnection of the titanium silicide layer. If it were tried to cause both the crystal phase transition from C49 to C54 of the titanium silicide layer and the cohesion reaction of the titanium silicide layer, then the disconnected C54 crystal phase titanium silicide layer with discontinuous and island-like surfaces is formed. For this reason, it is required to carry out commonly a single heat treatment for causing the crystal phase transition of C49 to C54 of the titanium silicide layer and causing the cohesion reaction of the C54 crystal phase titanium silicide layer.

As described above, according to the design requirement, a p$^+$-type diffusion layer of a width of not less than 2 micrometers is required, then no amorphous silicon is formed and an ion-implantation of BF$_2$ is carried out to form a p$^+$-type diffusion layer under different conditions for ion-implantation of BF$_2$ which was used to form the p$^+$-type diffusion layer 231a. If a heat treatment is carried out at a temperature of 950° C. for ten minutes, then an excess cohesion reaction is caused on the self-aligned C54 crystal phase titanium silicide layer, for which reason it is required to previously form the p+-type diffusion layer having the junction depth which is deeper than the junction depth of the p+-type diffusion layer 231a so as to prevent any formation of amorphous silicon.

Figure 6E:
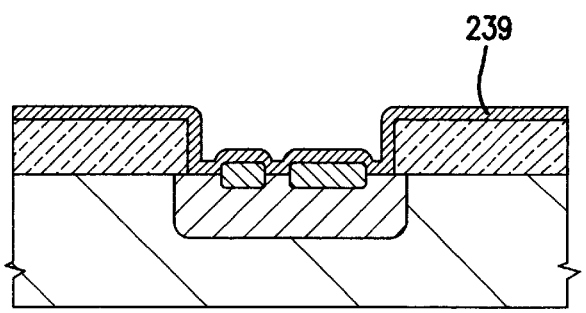

With reference to FIG. 6E, a titanium film 239 is entirely deposited by sputtering a titanium target. The titanium film 239 has a thickness of approximately 15 nanometers and extends over the field oxide films 211 and the p+-type diffusion layer 231.

Figure 6F:
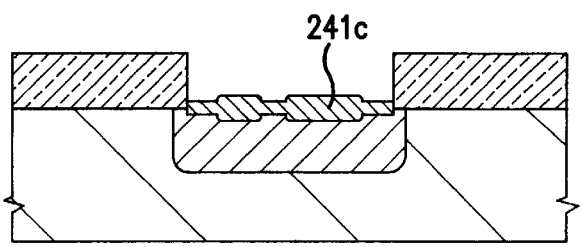

With reference to FIG. 6F, a rapid thermal anneal to the substrate is carried out at a temperature of 700° C. for thirty seconds in an nitrogen atmosphere to form a titanium nitride film which extends over an entire surface of the titanium film. At the same time, the rapid thermal anneal causes a silicidation reaction of titanium and silicon over the p+-type diffusion layer 231b thereby forming a self-aligned C49 crystal phase titanium silicide film. The self-aligned C49 crystal phase titanium silicide film has a thickness of approximately 30 nanometers. A mixing solution of H$_2$O$_2$ and NH$_4$OH is used to carry out a wet etching for selectively removal of unreacted titanium film residing over the field oxide films 211. A further rapid thermal annealing to the substrate is carried out at a temperature of 850° C. for ten seconds in an nitrogen atmosphere to cause a crystal phase transition from C49 to C54 thereby forming a C54 crystal phase titanium silicide film 241c over the p+-type diffusion layer 231b. The crystal defects are not completely recovered and some crystal defects still reside.

Figure 6G:
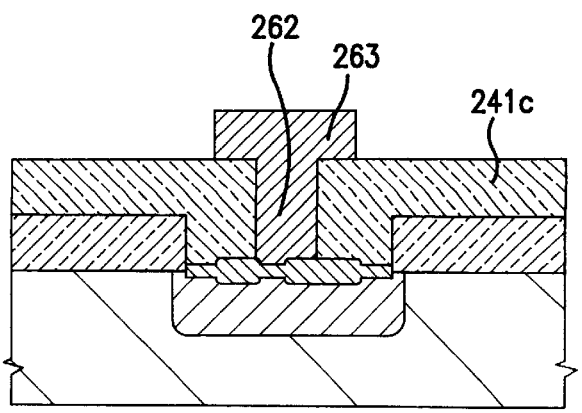

With reference to FIG. 6G, an inter-layer insulator 261 is entirely deposited by a chemical vapor deposition over the field oxide films 211 and over the cohered C54 crystal phase titanium silicide layer 241c. The inter-layer insulator 261 has a thickness of approximately 0.6 micrometers. A contact hole 262 is formed in the inter-layer insulator 261 and over the cohered C54 crystal phase titanium silicide layer 241c so that a part of the cohered C54 crystal phase titanium silicide layer 241c is shown through the contact hole 262. The contact hole 262 has a diameter of approximately 0.12 micrometers. It may be possible that for the purpose of forming a wide contact hole 262, the width of the p$^+$-type diffusion layer 231a is more than 0.2 micrometers. A metal interconnection 263 made of, for example, aluminum alloy is then formed within the contact hole and over the inter-layer insulator 261 in the vicinity of the contact hole 262.

The above semiconductor device has the titanium salicide structure wherein the p$^+$-type diffusion layer has a p$^+$-n junction depth of approximately 50 nanometers. The measured p$^+$-n junction leakage current is approximately 20 pA/mm$^2$. The p$^+$-type diffusion layer has an effective sheet resistance of 6–7 Ω/▽. As a result, the reduced sheet resistance is kept with suppressing any increase in p$^+$-n junction leakage. The above fabrication method is applicable to a semiconductor device required to be scaled down less than 0.25 micrometers.

The above fabricating method is applicable to formation of a p$^+$- type emitter layer in a p-n-p bipolar transistor. The above fabricating method is also applicable to formation of an n$^+$-type shallow junction diffusion layer with a salicide structure.

A fifth embodiment according to the present invention will be described in detail with reference to FIGS. 7A through 7D, wherein a cohesion reaction of the titanium silicide layer is caused to form island-like or disconnected titanium silicide layers.

Figure 7A:
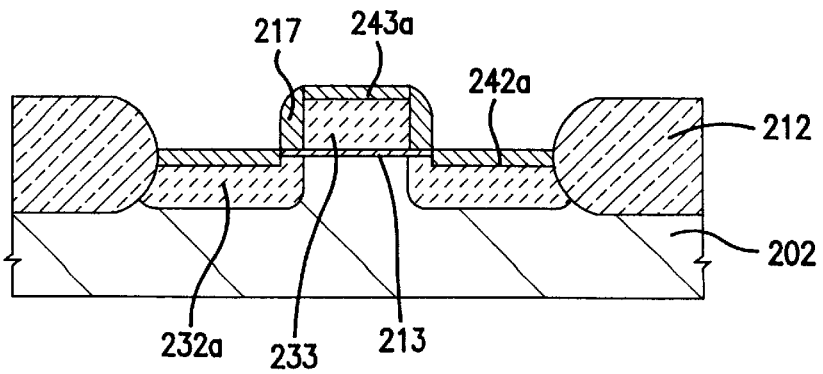
FIGS. 7A through 7D are fragmentary cross sectional elevation views illustrative of a method of forming a semiconductor substrate on which a titanium salicide shallow junction diffusion layer is formed in a fifth embodiment according to the present invention.

With reference to FIG. 7A, an n-type silicon substrate 202 is prepared, which has an impurity concentration of $1 \times 10^{17}$ cm$^{-3}$. Field oxide films 212 are selectively formed over a surface of the n-type silicon substrate 202 by a local oxidation of silicon method. The field oxide films 212 has a thickness of 0.2 micrometers. An active region of the silicon substrate 202 is defined by the field oxide films 212. A thermal oxidation of silicon is carried out to form a gate oxide film 213 over the active region of the silicon substrate 202. The gate oxide film 213 has a thickness of approximately 9 nanometers. A width of the active region is approximately 750 nanoemters.

As a modification, in place of the n-type silicon substrate 202, it is possible that an n-well region having an impurity concentration of $1 \times 10^{17}$ cm$^{-3}$ is formed in an upper region of a p-type silicon substrate having an impurity concentration of $1 \times 10^{15}$ cm$^{-3}$.

Subsequently, an undoped polysilicon film having a thickness of approximately 200 nanometers is entirely formed, which extends over the gate oxide film 213 and the field oxide films 212. The undoped polysilicon film is then patterned to form an undoped polysilicon film pattern over the gate oxide film. The undoped polysilicon film pattern has a line width of 0.2 micrometers.

An insulation film made of either silicon oxide or silicon nitride is entirely deposited for etch back by subsequent anisotropic etching to remove the insulation film except on side walls of the undoped polysilicon film pattern 114 thereby forming side wall oxide films on the side walls of the undoped polysilicon film pattern.

A thermal oxidation of silicon is carried out to form silicon oxide films over the gate electrode and over the active region of the silicon substrate 202 except under the gate electrode and the side wall oxide films 217. The silicon oxide films have a thickness of approximately 10 nanometers. An ion-implantation of Si is carried out at a dose of $1 \times 10^{15}$ cm$^{-2}$ and an ion-implantation energy of 20 keV by use of the field oxide films 212 and the side wall oxide films 217 as masks to form self-aligned amorphous silicon layers having a depth of approximately 70 nanometers in an upper region of the silicon substrate 202 as well as form an amorphous silicon layer in an upper region of the undoped polysilicon film pattern. As compared to the n-type silicon substrate 202, the channeling phenomenon is unlikely to appear on the undoped polysilicon film pattern, for which reason the amorphous silicon layer has a slightly shallower depth than the self-aligned amorphous silicon layers.

As a modification, in place of the ion-implantation of silicon, it is possible to carry out an ion-implantation of Ge at a dose of $1 \times 10^{15}$ cm$^{-2}$ and an ion-implantation energy of 30 keV.

An ion-implantation of BF$_2$ is carried out at a dose of $1 \times 10^{15}$ cm$^{-2}$ and an ion-implantation energy of 10 keV for subsequent heat treatment at a temperature of 600° C. for one hour thereby to form p$^+$-type diffusion layers 232a having a junction depth of 50 nanometers in an upper region of the n-type silicon substrate 202. As a result, both the amorphous silicon layer 223 and the remaining undoped polysilicon film pattern are made into a p$^+$-type polysilicon pattern 233. The p$^+$-type diffusion layers 232a have a width of approximately 0.2 micrometers. The p$^+$-type polysilicon pattern 233 has a thickness of 200 nanometers which is larger than a junction depth of p+-type diffusion layers 232a. Since, however, a diffusion rate of a conductive impurity in the polysilicon film is sufficiently large, it is possible to form the polysilicon film pattern 233.

The silicon oxide films 218 are removed before a titanium film is entirely deposited, which has a thickness of 5 nanometers. A rapid thermal anneal is carried out at a temperature of 700° C. for 30 seconds in a nitrogen atmosphere whereby a titanium nitride film is formed on an entire surface of the titanium film as well as self-aligned C49 crystal phase titanium silicide layers are formed over the p$^+$-type diffusion layers 232a and over the undoped polysilicon film pattern 233. A mixing solution of hydrogen peroxide with ammonium is used for a wet etching to selectively remove the titanium nitride film and the unreacted titanium film. A rapid thermal anneal is carried out at a temperature of 850° C. for 10 seconds to cause a crystal phase transition of C49 to C54 whereby the self-aligned C49 crystal phase titanium silicide layers are made into C54 crystal phase titanium silicide layers 242a and 243a. Namely, the C54 crystal phase titanium silicide layers 242a are formed in upper regions of the p$^+$-type diffusion layers 232a as well as the C54 crystal phase titanium silicide layer 243a is formed in an upper region of the undoped polysilicon film pattern 233.

Figure 7B:
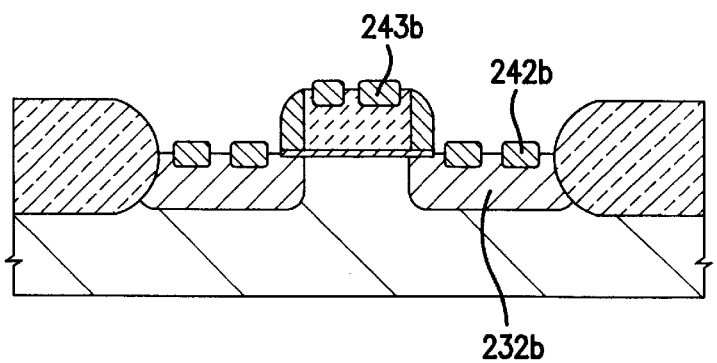

With reference to FIG. 7B, a heat treatment is carried out at a temperature of 950° C. for 10 minutes to cause a cohesion reaction of the C54 crystal phase titanium silicide layers 242a and 243a so that the C54 crystal phase titanium silicide layers 242a and 243a are made into the cohered C54 crystal phase titanium silicide layers 242b and 243b as well as the p$^+$-type diffusion layers 232a are made into the cohered p$^+$-type diffusion layers 232b.

Figure 7C:
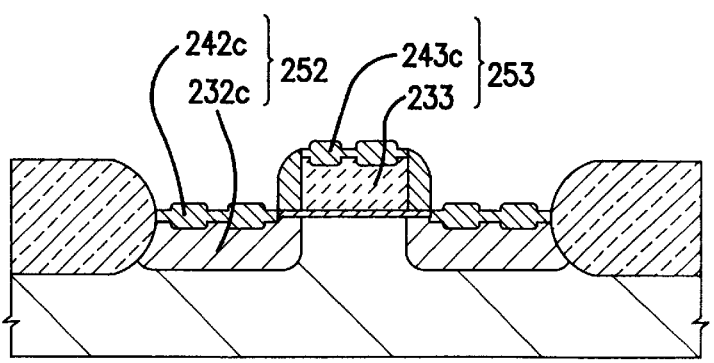
Figure 7D:
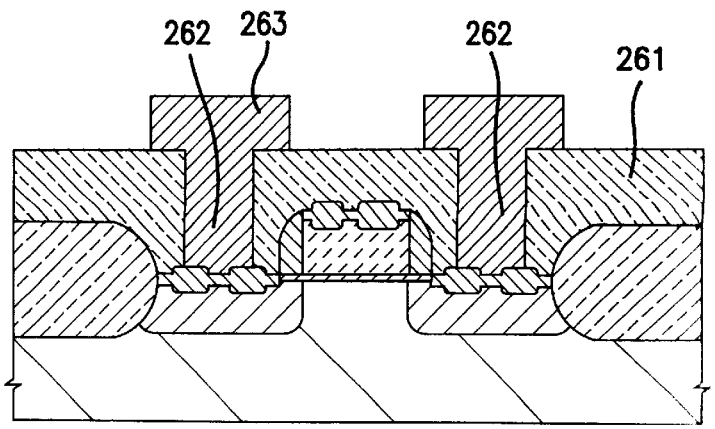

With reference to FIG. 7C, a further titanium film is entirely deposited, which has a thickness of 15 nanometers. A rapid thermal anneal is carried out at a temperature of 700° C. for 30 seconds in a nitrogen atmosphere whereby another titanium nitride film is formed on an entire surface of the titanium film as well as self-aligned C49 crystal phase titanium silicide layers are formed over the p$^+$-type diffusion layers 232b and over the undoped polysilicon film pattern 233. A mixing solution of hydrogen peroxide with ammonium is used for a wet etching to selectively remove the titanium nitride film and the unreacted titanium film. A rapid thermal anneal is carried out at a temperature of 850° C. for 10 seconds to cause a crystal phase transition of C49 to C54 whereby the self-aligned C49 crystal phase titanium silicide layers are made into C54 crystal phase titanium silicide layers 242c and 243c. Namely, the C54 crystal phase titanium silicide layers 242c are formed in upper regions of the p$^+$-type diffusion layers 232c as well as the C54 crystal phase titanium silicide layer 243c is formed in an upper region of the undoped polysilicon film pattern 233. As a result, formations are made for titanium salicide source/drain diffusion layers 252 comprising the p$^+$-type diffusion layers 232c and the cohered C54 crystal phase titanium silicide layers 242c. A further formation is made for a titanium polyside gate electrode 253 comprising the undoped polysilicon film pattern 233 and the cohered C54 crystal phase titanium silicide layer 243c. As a result, the p-channel MOS field effect transistor is made.

As a modification, it is possible to have carried out the heat treatment for causing the cohesion reaction before the inter-layer insulator 161 is formed.

With reference to FIG. 7G, an inter-layer insulator 261 is entirely formed by a chemical vapor deposition over the field oxide films 212 and the C54 crystal phase titanium silicide layers 242c and 243c. The interlayer insulator 261 is made of silicon oxide and has a thickness of approximately 0.6 micrometers. Contact holes 262 are formed in the interlayer insulator 261 and over the cohered C54 crystal phase titanium silicide layers 242b so that parts of the cohered C54 crystal phase titanium silicide layers 242c are shown through the contact holes 262. The contact holes 262 have a diameter of approximately 0.12 micrometers. It may be possible that for the purpose of forming wide contact holes 262, the width of the p$^+$-type diffusion layers 232c is more than 0.2 micrometers. Metal interconnections 263 made of, for example, aluminum alloy are then formed within the contact hole and over the inter-layer insulator 261 in the vicinity of the contact holes 262.

The above semiconductor device has substantially the same effect as in the fourth embodiment. It is further possible to suppress any increase in sheet resistance of the titanium polyside gate structure. The above fabrication method is applicable to the n-channel MOS field effect transistor.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A method of recovering crystal defects in an impurity doped diffusion silicon layer extending in contact with a C54 crystal phase titanium silicide layer, said method comprising the step of:

causing a cohesion reaction of said C54 crystal phase titanium silicide layer by heat treating said C54 crystal phase titanium silicide layer so as to cause a vacancy-diffusion of lattice-vacancy of silicon atoms from said C54 crystal phase titanium silicide layer into said impurity doped diffusion silicon layer which includes said crystal defects while maintaining continuity of the C54 crystal phase titanium silicide layer.

2. The method as claimed in claim 1, wherein said crystal defects were generated when an amorphous silicon layer was reformed into said impurity doped diffusion silicon layer.

3. The method as claimed in claim 1, wherein said heat treatment is carried out at a temperature from 600° C. to 750° C. for 2.5 to 10 minutes.

4. The method as claimed in claim 3, wherein said heat treatment is carried out at a temperature of approximately 650° C. for approximately 10 minutes.

5. A method of forming an extremely shallow titanium salicide diffusion layer comprising the steps of:

forming an amorphous silicon layer in a silicon substrate by an ion-implantation;

subjecting said silicon substrate to a first heat treatment to crystallize said amorphous silicon layer to form an impurity doped diffusion silicon layer;

depositing a titanium film on said impurity doped diffusion silicon layer;

subjecting said impurity dope diffusion silicon layer to a second heat treatment to cause a silicidation reaction of titanium with silicon thereby forming a C49 crystal phase titanium silicide layer in an upper region of said impurity doped diffusion silicon layer;

subjecting said C49 crystal phase titanium silicide layer to a third heat treatment to cause a crystal phase transition from C49 to C54 so that said C49 crystal phase titanium silicide layer is made into a C54 crystal phase titanium silicide layer; and causing a cohesion reaction of said C54 crystal phase titanium silicide layer by a fourth heat treatment to said C54 crystal phase titanium silicide layer so as to cause a vacancy-diffusion of lattice-vacancy of silicon atoms from said C54 crystal phase titanium silicide layer into said impurity doped diffusion silicon layer which includes said crystal defects while maintaining continuity of the C54 crystal phase titanium silicide layer.

6. The method as claimed in claim 5, wherein said crystal defects were generated when the amorphous silicon layer was reformed into said impurity doped diffusion silicon layer.

7. The method as claimed in claim 5, wherein said fourth heat treatment is carried out at a temperature from 600° C. to 750° C. for 2.5 to 10 minutes.

8. The method as claimed in claim 7, wherein said fourth heat treatment is carried out at a temperature of approximately 650° C. for approximately 10 minutes.

9. The method as claimed in claim 5, wherein the amorphous silicon layer is 1.2 to 1.5 times deeper than the impurity doped diffusion silicon layer.

10. The method as claimed in claim 5, wherein said third heat treatment is a rapid thermal anneal in which a highest temperature is no greater than 850° C.

11. The method of claim 10, wherein said fourth heat treatment is carried out at a temperature less than the temperature of the third heat treatment.

12. The method of claim 5, where said fourth heat treatment is carried out at a temperature less than the temperature of the third heat treatment.

* * * * *